(12) United States Patent
Sakaguchi (10) Patent No.: US 10,613,122 B2
(45) Date of Patent: Apr. 7, 2020

(54) MONITORING CIRCUIT AND SEMICONDUCTOR DEVICE

(71) Applicant: ABLIC Inc., Chiba-shi, Chiba (JP)

(72) Inventor: Kaoru Sakaguchi, Chiba (JP)

(73) Assignee: ABLIC Inc., Chiba-shi (JP)

( * ) Notice: Subject to any disclaimer, the term of this patent is extended or adjusted under 35 U.S.C. 154(b) by 226 days.

(21) Appl. No.: 15/939,936

(22) Filed: Mar. 29, 2018

(65) Prior Publication Data

US 2018/0284164 A1 Oct. 4, 2018

(30) Foreign Application Priority Data

Mar. 31, 2017 (JP) ................. 2017-072218

(51) Int. Cl.
*G01R 19/165* (2006.01)
*G06F 1/3287* (2019.01)
*G06F 1/3206* (2019.01)

(52) U.S. Cl.
CPC . *G01R 19/16538* (2013.01); *G01R 19/16552* (2013.01); *G01R 19/16571* (2013.01); *G06F 1/3206* (2013.01); *G06F 1/3287* (2013.01)

(58) Field of Classification Search
CPC ........ G01R 19/16538; G01R 19/16571; G01R 19/16552; G06F 1/3287; G06F 1/3206
See application file for complete search history.

(56) References Cited

FOREIGN PATENT DOCUMENTS

JP 2004-140423 A 5/2004

*Primary Examiner* — Amy He
(74) *Attorney, Agent, or Firm* — Brinks Gilson & Lione (57) ABSTRACT

Provided is a monitoring circuit for a system including an LDO regulator. The monitoring circuit includes: a non-saturation detection circuit configured to detect a non-saturation state of an output transistor of the LDO regulator configured to supply a power supply voltage to an MPU; a current detection circuit configured to detect that an output current from the output transistor is equal to or more than a predetermined current value; and a watchdog timer configured to monitor operation of the MPU. The watchdog timer is enabled when the output transistor is not in a non-saturation state and an output current from the output transistor is equal to or more than a predetermined current value.

10 Claims, 7 Drawing Sheets

Prior Art

FIG. 7

MONITORING CIRCUIT AND SEMICONDUCTOR DEVICE

RELATED APPLICATIONS

This application claims priority under 35 U.S.C. § 119 to Japanese Patent Application No. 2017-072218 filed on Mar. 31, 2017, the entire content of which is hereby incorporated by reference.

BACKGROUND OF THE INVENTION

1. Field of the Invention

The present invention relates to a monitoring circuit configured to monitor operation of a microprocessor and the like, and to a semiconductor device including the monitoring circuit.

2. Description of the Related Art

A watchdog timer is generally known as a monitoring circuit for various integrated systems including a microprocessor (MPU).

Figure 7:
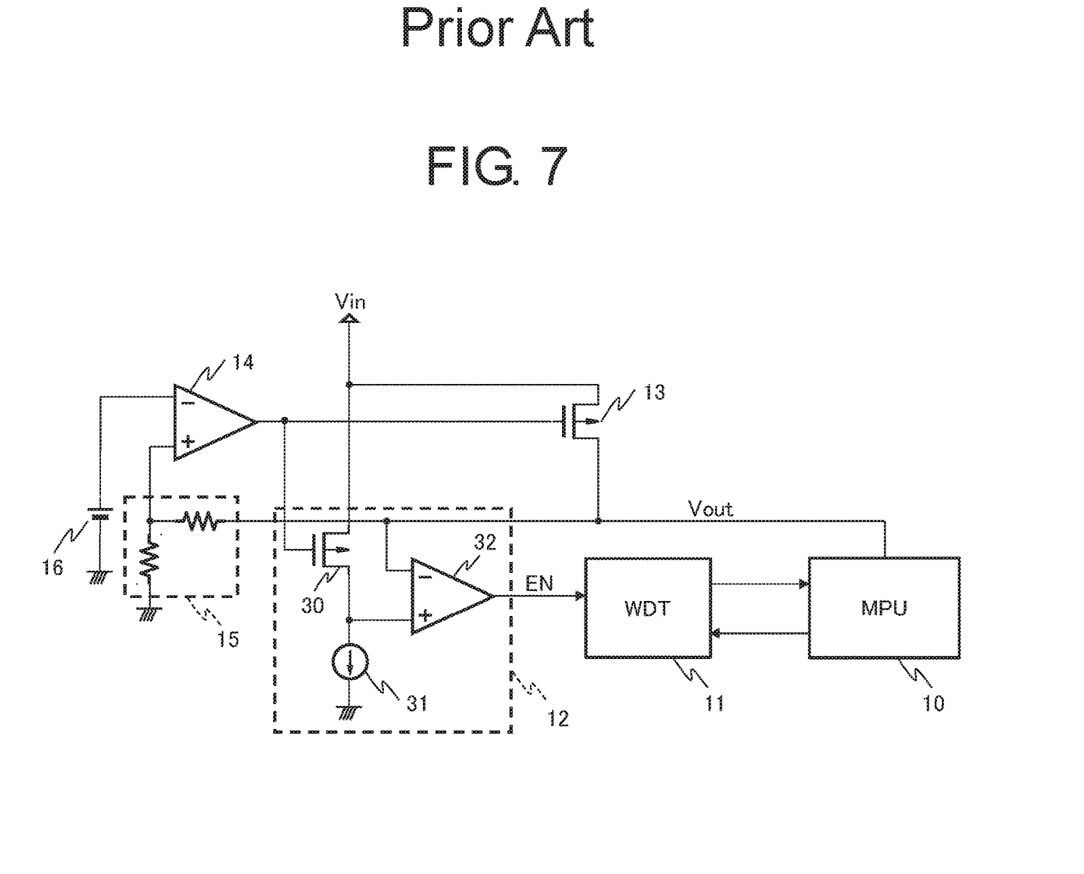
FIG. 7 is a block diagram of a general system having an MPU.

FIG. 7 is a block diagram of a general system having an MPU.

The general system having an MPU includes: an MPU 10 under surveillance; a watchdog timer 11; a current detection circuit 12 configured to detect an operation state of the MPU 10; and an LDO regulator section including an output transistor 13, an error amplifier 14, a feedback circuit 15, and a reference voltage source 16. The current detection circuit 12 includes a sense transistor 30, a constant current source 31, and a comparator 32.

The LDO regulator section supplies current to the MPU 10. The watchdog timer 11 periodically receives signals from the MPU 10, to thereby monitor the MPU 10. The current detection circuit 12 detects an amount of current flowing to the MPU 10 from a power source to determine an operation state of the MPU 10 to be in, for example, an operation mode or a stand-by mode, and outputs a control signal EN to the watchdog timer 11.

In the general system having an MPU configured as described above, the current detection circuit 12 stops the watchdog timer 11 during a stand-by mode of the MPU 10, and thus power consumption of the system having an MPU can be reduced.

For example, in an operation mode of the MPU 10 a current of from several tens of milliamperes to several hundreds of milliamperes flows therethrough, while in the stand-by mode of the MPU 10 a current of from several tens of microamperes to several hundreds of microamperes flows therethrough. The current detection circuit 12 determines the operation state of the MPU 10 by the difference of the amount of current which depend on the operation state of the MPU 10 by, for example, setting a threshold value to about several milliamperes and detecting the amount of current flowing to the MPU 10. As the current detection circuit 12, a circuit described in Japanese Patent Application Laid-open No. 2004-140423 is known, for example.

In general, in order to achieve a low dropout voltage, an LDO regulator is designed so that an output transistor has a small ON resistance Ron. Specifically, the ON resistance Ron of the output transistor is from several hundreds of milliohms to several ohms in a non-saturation state. Meanwhile, a current detection value Idet for determining the operation mode of the MPU 10 is as small as, for example, a value of one digit in the unit of milliamperes. Accordingly, when the output transistor 13 enters the non-saturation state, the magnitude of a drain-source voltage Vds of the output transistor 13 is given by Ron×Idet, and becomes a value of one digit with the unit being millivolts around the current detection value. Under this state, when the output from the comparator 32 is inverted, a drain-source voltage Vds of the sense transistor 30 becomes several millivolts similarly to that of the output transistor 13.

When the transistor is in the non-saturation state, a drain current from the transistor is in a substantially proportional relationship with the drain-source voltage. Accordingly, when the drain-source voltage Vds of the sense transistor 30 only deviates several millivolts, that is, when a voltage input to a non-inverting input terminal of the comparator 32 only deviates several millivolts, the current detection value Idet greatly varies in proportion to the deviation.

SUMMARY OF THE INVENTION

The present invention has been made to provide a monitoring circuit and a semiconductor device capable of reducing, in a system having an MPU, power consumption of the system having an MPU even when an output transistor enters a non-saturation state, and stably monitoring operation of the MPU.

There is provided a monitoring circuit including: a non-saturation detection circuit configured to detect a non-saturation state of an output transistor of the LDO regulator configured to supply a power supply voltage to an MPU; a current detection circuit configured to detect that an output current from the output transistor is equal to or more than a predetermined current value; and a watchdog timer configured to monitor operation of the MPU. The watchdog timer is enabled during a period in which the output transistor is not in a non-saturation state and an output current from the output transistor is equal to or more than a predetermined current value.

According to the monitoring circuit of the present invention, since the non-saturation detection circuit configured to detect the non-saturation state of the output transistor is provided, it is possible to reduce power consumption of the system having an MPU even when the output transistor enters the non-saturation state, and stably monitor the operation of the MPU.

DETAILED DESCRIPTION OF THE EMBODIMENTS

Figure 1:
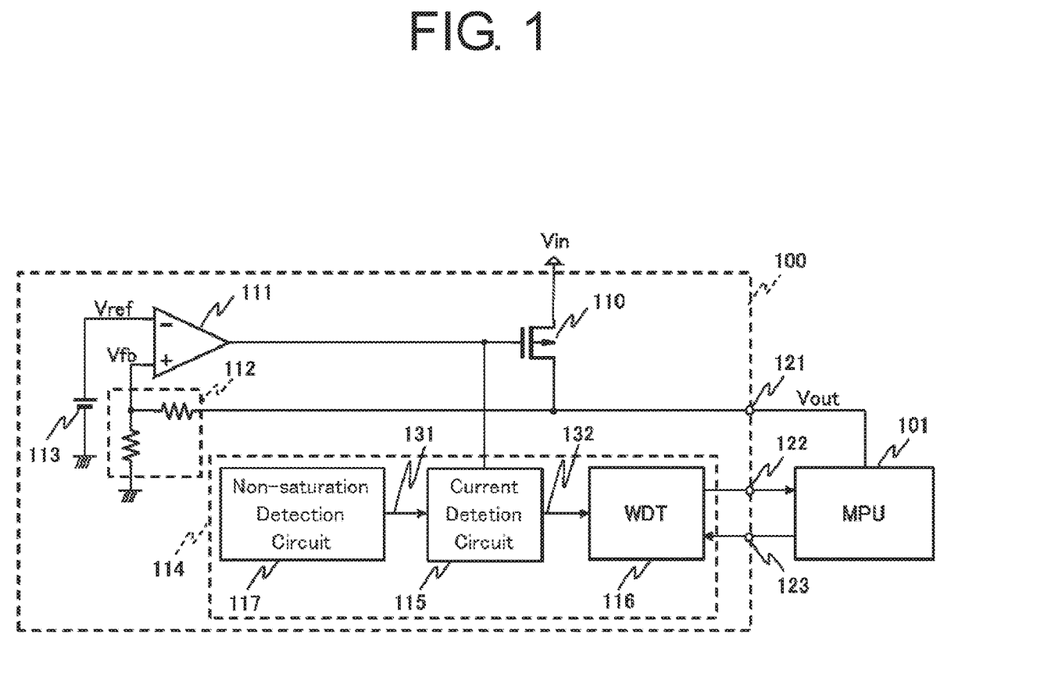
FIG. 1 is a circuit diagram for illustrating a semiconductor device including a monitoring circuit according to a first embodiment of the present invention.

FIG. 1 is a circuit diagram for illustrating a semiconductor device 100 including a monitoring circuit 114 according to a first embodiment of the present invention.

The semiconductor device 100 includes: an the LDO regulator section which includes an output transistor 110, an error amplifier 111, a feedback circuit 112, and a reference voltage source 113; and the monitoring circuit 114 which includes a current detection circuit 115, a watchdog timer 116, and a non-saturation detection circuit 117.

The output transistor 110 has a source connected to a power supply terminal, a gate connected to an output terminal of the error amplifier 111, and a drain connected to a voltage output terminal 121 and an input terminal of the feedback circuit 112. An output terminal of the feedback circuit 112 is connected to a non-inverting input terminal of the error amplifier 111. The reference voltage source 113 has one terminal connected to an inverting input terminal of the error amplifier 111 and the other terminal connected to a ground terminal.

An output terminal of the non-saturation detection circuit 117 is connected to a non-saturation detection input terminal of the current detection circuit 115. The current detection circuit 115 has a current detection input terminal connected to the gate of the output transistor 110 and an output terminal connected to an enable terminal of the watchdog timer 116. The watchdog timer 116 is connected to an input terminal 123 and an output terminal 122.

The voltage output terminal 121, the input terminal 123, and the output terminal 122 are connected to a microprocessor (MPU) 101 which is a semiconductor device under surveillance.

Only minimum connections are described herein, but, although not shown, connections required for configurations of specific examples of the current detection circuit 115 and the non-saturation detection circuit 117 which are described below should be made in accordance with the respective examples.

Description is given to operation of the semiconductor device 100 according to the first embodiment.

The LDO regulator section which includes the output transistor 110, the error amplifier 111, the feedback circuit 112, and the reference voltage source 113 supplies an output voltage Vout to the voltage output terminal 121 from a voltage Vin applied to the power supply terminal based on a reference voltage Vref. Drop of the output voltage Vout causes drop of the feedback voltage Vfb which the feedback circuit 112 outputs. The error amplifier 111 controls the gate of the output transistor 110 based on an error between the feedback voltage Vfb and the reference voltage Vref to cause the output voltage Vout to rise. In contrast, rise of the output voltage Vout causes the error amplifier 111 to control the gate of the output transistor 110 to lower the output voltage Vout. With a negative feedback circuit configured as described above, the LDO regulator section performs control so that the output voltage Vout becomes a predetermined voltage based on the reference voltage Vref. The MPU 101 has a power supply terminal connected to the voltage output terminal 121, and the power supply voltage is controlled so as to be constant by the LDO regulator section. A power supply current for the MPU 101 is supplied from an output current from the output transistor 110. When the power supply current for the MPU 101 is sufficiently large with respect to a current flowing into the input terminal of the feedback circuit 112, the power supply current for the MPU 101 and the output current from the output transistor 110 are substantially equal to each other.

When the non-saturation detection circuit 117 detects a possibility that the output transistor 110 may enter a non-saturation state, the non-saturation detection circuit 117 outputs a non-saturation detection signal 131 to the non-saturation detection input terminal of the current detection circuit 115. The non-saturation detection circuit 117 detects the possibility that the output transistor 110 may enter a non-saturation state from, for example, the fact that the power supply voltage Vin drops to approach the predetermined output voltage Vout.

In a case where the non-saturation detection signal 131 is not provided to the non-saturation detection input terminal of the current detection circuit 115, when the current detection circuit 115 detects that the output current from the output transistor 110 exceeds a predetermined current value, the current detection circuit 115 determines that the MPU 101 is in an operation mode, and outputs an enable signal 132 to the enable terminal of the watchdog timer 116. Further, when the current detection circuit 115 detects that the output current from the output transistor 110 falls below the predetermined current value, the current detection circuit 115 determines that the MPU 101 is in a stand-by mode, and stops the enable signal 132 to the enable terminal of the watchdog timer 116. In addition, during a period in which the non-saturation detection signal 131 is provided to the non-saturation detection input terminal, the current detection circuit 115 stops the enable signal 132 irrespective of the magnitude of the output current from the output transistor 110.

When a signal is provided to the enable terminal of the watchdog timer 116, the watchdog timer 116 enters an enable state, and performs a monitoring operation for the MPU 101. Further, when the signal input to the enable terminal is halted, the watchdog timer 116 enters a disable state, and stops the monitoring operation for the MPU 101. When the watchdog timer 116 is in the enable state and detects a possibility of a runaway of the MPU 101 based on a monitoring signal provided from the external MPU 101 to the input terminal 123, the watchdog timer 116 outputs a reset signal to the output terminal 122 in order to reset the MPU 101. When the watchdog timer 116 is in the disable state, the watchdog timer 116 stops the monitoring operation for the MPU 101.

In this manner, with the monitoring circuit 114 according to the first embodiment, it is possible to reduce power consumption of the semiconductor device 100 without being affected by deterioration of current detection accuracy of the current detection circuit 115 even when the power supply voltage Vin drops and the output transistor 110 enters the non-saturation state. Because the monitoring by the watchdog timer 116 is halted by stopping the enable signal 132 supplied from the current detection circuit 115 by output from the non-saturation detection circuit 117.

Depending on specifications of the MPU 101, the current detection circuit 115 may output the enable signal 132 to the watchdog timer 116 irrespective of the magnitude of the output current from the output transistor 110 when the non-saturation detection signal 131 is provided to the current detection circuit 115.

Figure 2:
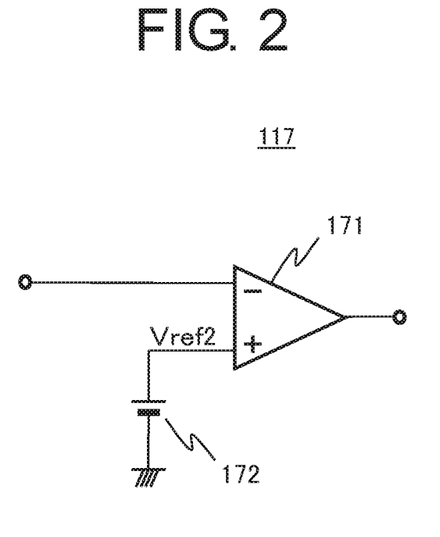
FIG. 2 is a circuit diagram for illustrating an example of a non-saturation detection circuit.

FIG. 2 is a circuit diagram for illustrating an example of the non-saturation detection circuit 117.

The non-saturation detection circuit 117 of FIG. 2 includes a comparator 171 and a reference voltage source 172.

The comparator 171 has an inverting input terminal connected to the gate of the output transistor 110, a non-inverting input terminal connected to the reference voltage source 172, and an output terminal connected to the output terminal of the non-saturation detection circuit 117.

When the power supply voltage Vin drops to approach the predetermined output voltage Vout, the drain-source voltage Vds of the output transistor 110 drops, and thus the output transistor 110 approaches the non-saturation state. At this time, since the output voltage Vout drops, the error amplifier 111 causes a gate voltage of the output transistor 110 to drop. That is, when the voltage of the inverting input terminal of the comparator 171 drops to fall below a reference voltage Vref2 of the reference voltage source 172, the comparator 171 outputs the non-saturation detection signal 131.

When the power supply voltage Vin rises to exceed the predetermined output voltage Vout, the drain-source voltage Vds of the output transistor 110 rises, and thus the output transistor 110 approaches a saturation state. At this time, the error amplifier 111 controls the gate voltage of the output transistor 110 so that the output voltage Vout becomes the predetermined voltage. The reference voltage Vref2 is set to be smaller than the gate voltage of the output transistor 110, and hence the comparator 171 stops the output of the non-saturation detection signal 131.

With the non-saturation detection circuit 117 having the configuration described above, it is possible to achieve a circuit for detecting a non-saturation state of an output transistor using a simple circuit.

The description has been given to the non-saturation detection circuit 117 including the comparator 171 and the reference voltage source 172, but the non-saturation detection circuit 117 may include an offset comparator instead. When the non-saturation detection circuit 117 includes an offset comparator, the voltage of the power supply terminal and the voltage of the output terminal of the output transistor may be compared to each other.

When the power supply voltage Vin drops to approach the predetermined output voltage Vout, the drain-source voltage Vds of the output transistor 110 drops. The output transistor 110 enters the non-saturation state when a saturation condition given by Expression 1 is not satisfied wherein the threshold voltage of the output transistor 110 is denoted by Vth and the gate-source voltage thereof is denoted by Vgs.

$$Vds \geq Vgs - Vth \quad (1)$$

The offset comparator detects the non-saturation state of the output transistor 110 by detecting that the drain-source voltage Vds of the output transistor 110 drops and thus the difference between the voltages of input terminals is equal to or less than a predetermined offset voltage.

In this case, there is an advantage that the non-saturation detection signal 131 can be supplied relatively early because the drop of the drain-source voltage Vds of the output transistor 110 can be directly detected.

Figure 3:
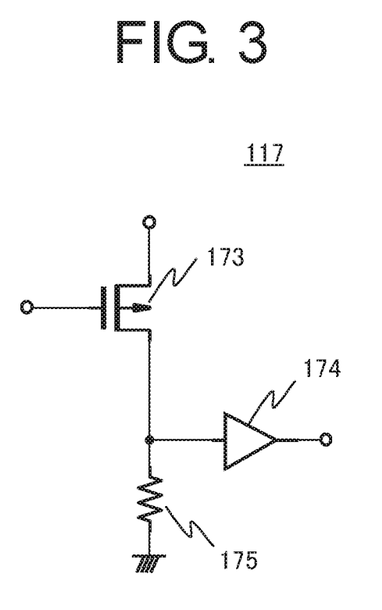
FIG. 3 is a circuit diagram for illustrating another example of the non-saturation detection circuit.

FIG. 3 is a circuit diagram for illustrating another example of the non-saturation detection circuit 117.

The non-saturation detection circuit 117 of FIG. 3 includes a sense transistor 173, a voltage detection circuit 174, and a resistor 175.

The sense transistor 173 has a gate connected to the gate of the output transistor 110, a source connected to the power supply terminal, and a drain connected to one terminal of the resistor 175 and an input terminal of the voltage detection circuit 174. An output terminal of the voltage detection circuit 174 is connected to the output terminal of the non-saturation detection circuit 117.

The sense transistor 173 causes a drain current that is proportional to a drain current from the output transistor 110 to flow. Across both terminals of the resistor 175, voltage is generated due to the drain current from the sense transistor 173.

The non-saturation detection circuit 117 detects the non-saturation state of the output transistor 110 by the voltage of the resistor 175 and a threshold voltage of the voltage detection circuit 174, and outputs the non-saturation detection signal 131.

It is possible to reduce current consumption of the non-saturation detection circuit 117 by, for example, setting the drain current from the sense transistor 173 to be small when the output current from the output transistor 110 is small and forming the voltage detection circuit 174 with an inverter having constant current limitation so that no constant circuit current flows therethrough. In addition, the same effect can be obtained also when a constant current source is used instead of the resistor 175.

Using the circuit of FIG. 3, it is possible to achieve the non-saturation detection circuit 117 of the monitoring circuit 114 of FIG. 1 by a simple circuit, and further, to reduce current consumption as compared to the non-saturation detection circuit 117 of FIG. 2.

Figure 4:
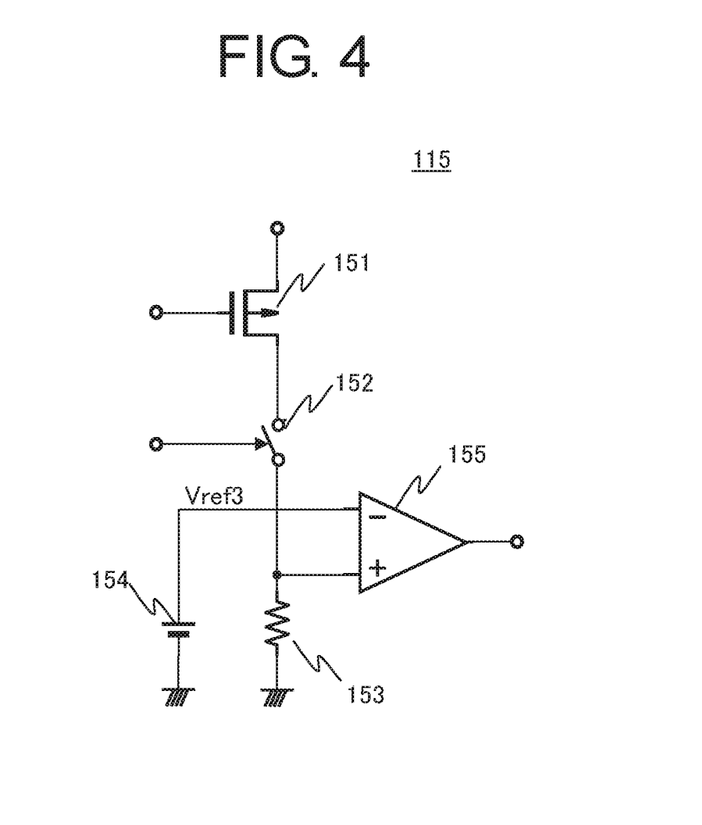
FIG. 4 is a circuit diagram for illustrating an example of a current detection circuit.

FIG. 4 is a circuit diagram for illustrating an example of the current detection circuit 115 of the monitoring circuit 114 according to the first embodiment.

The current detection circuit 115 of FIG. 4 includes a sense transistor 151, a switch 152, a resistor 153, a reference voltage source 154, and a comparator 155.

The sense transistor 151 has a source connected to the power supply terminal, a gate connected to the gate of the output transistor 110, and a drain connected to one terminal of the switch 152. The other terminal of the switch 152 is connected to the resistor 153 and a non-inverting input terminal of the comparator 155. The comparator 155 has an inverting input terminal connected to the reference voltage source 154 and an output terminal connected to the output terminal of the current detection circuit 115. The switch 152 is in a conductive state when the non-saturation detection signal from the non-saturation detection circuit 117 is halted, and enters a non-conductive state during a period in which the non-saturation detection signal is provided thereto.

In the current detection circuit 115, during a period in which the non-saturation detection signal 131 is provided from the non-saturation detection circuit 117, the switch 152 enters a non-conductive state, and hence the comparator 155 stops output of the enable signal 132.

As described above, using the switch 152 which enters a non-conductive state during a period in which the non-saturation detection signal 131 is provided to the current detection circuit 115, it is possible to easily achieve the monitoring circuit 114 which stops the monitoring by the watchdog timer 116 when the output transistor 110 is in the non-saturation state.

Figure 5:
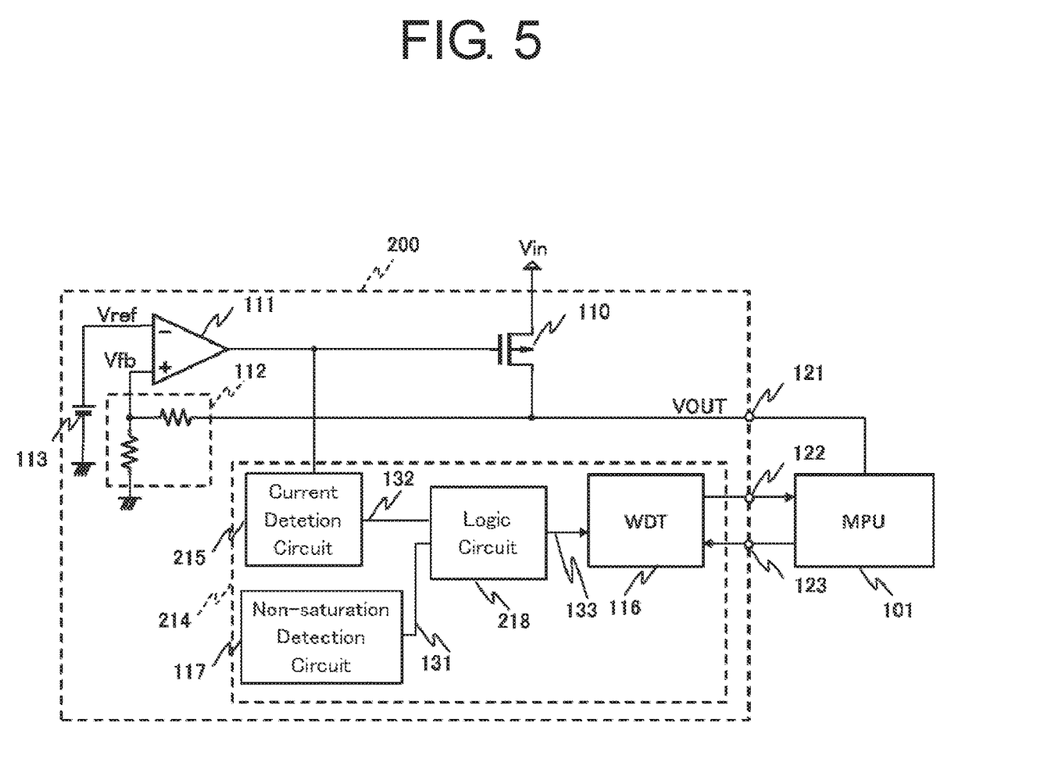
FIG. 5 is a circuit diagram for illustrating a semiconductor device including a monitoring circuit according to a second embodiment of the present invention.

FIG. 5 is a circuit diagram for illustrating a semiconductor device 200 including a monitoring circuit 214 according to a second embodiment of the present invention.

The same portions as those of the semiconductor device 100 according to the first embodiment are denoted by the same reference symbols, and description thereof is omitted.

The monitoring circuit 214 of the semiconductor device 200 according to the second embodiment includes the watchdog timer 116, the non-saturation detection circuit 117, a current detection circuit 215, and a logic circuit 218. The current detection circuit 215 has a configuration in which the switch 152 is eliminated from the current detection circuit 115.

The enable signal 132 supplied from the current detection circuit 215 is provided to a first input terminal of the logic circuit 218. The non-saturation detection signal 131 supplied from the non-saturation detection circuit 117 is provided to a second input terminal of the logic circuit 218. A second enable signal 133 supplied from the logic circuit 218 is provided to the enable terminal of the watchdog timer 116.

During a period in which the non-saturation detection signal 131 is provided to the logic circuit 218, the logic circuit 218 determines that the power supply voltage Vin drops and the current detection accuracy of the current detection circuit 115 is deteriorated, and does not output the second enable signal 133 to the watchdog timer 116 irrespective of whether or not the enable signal 132 is provided to the logic circuit 218.

With the semiconductor device 200 according to the second embodiment configured as described above, the same effect as that of the semiconductor device 100 according to the first embodiment can be obtained.

Figure 6:
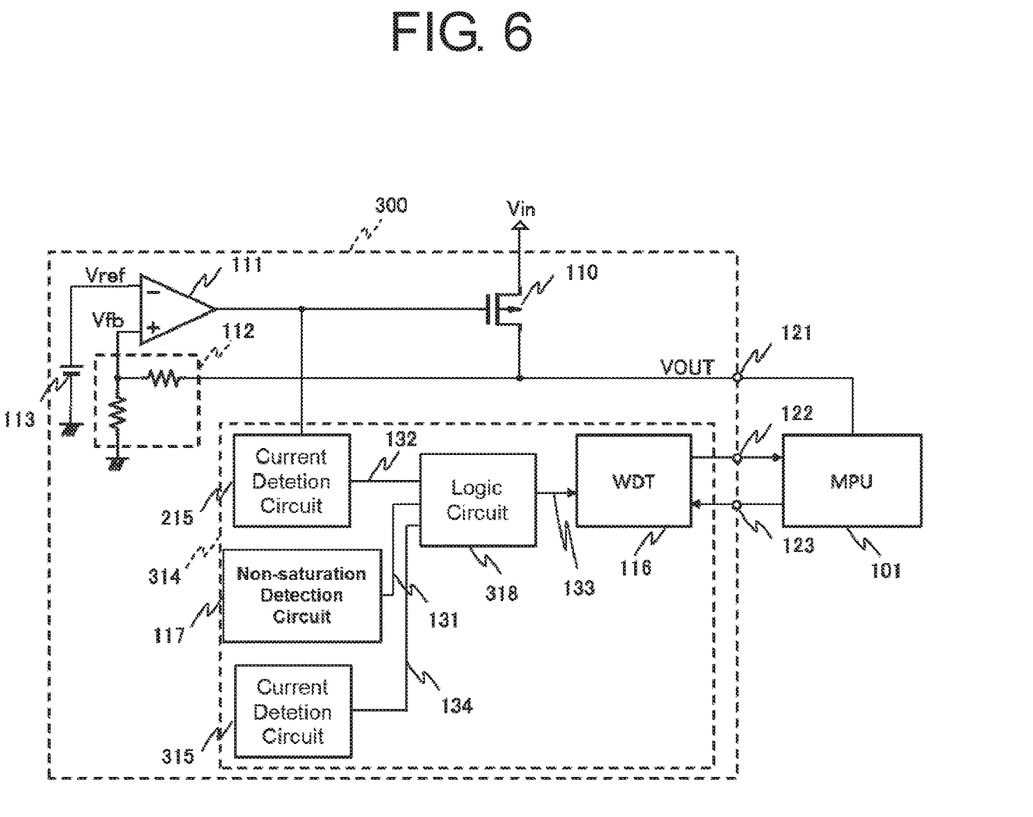
FIG. 6 is a circuit diagram for illustrating a semiconductor device including a monitoring circuit according to a third embodiment of the present invention.

FIG. 6 is a circuit diagram for illustrating a semiconductor device 300 including a monitoring circuit 314 according to a third embodiment of the present invention.

The same portions as those of the semiconductor device 200 according to the second embodiment are denoted by the same reference symbols, and description thereof is omitted.

The monitoring circuit 314 of the semiconductor device 300 according to the third embodiment includes the watchdog timer 116, the non-saturation detection circuit 117, the current detection circuit 215, a current detection circuit 315 serving as the second current detection circuit, and a logic circuit 318.

When the output transistor 110 is in the non-saturation state, the current detection circuit 315 outputs a current detection signal 134 based on whether or not the output current from the output transistor 110 is equal to or more than a predetermined value.

The current detection circuit 315 is formed of, for example, an offset comparator having an inverting input terminal connected to the power supply terminal and a non-inverting input terminal connected to the voltage output terminal 121. When the output transistor 110 enters the non-saturation state, the output current from the output transistor 110 is substantially proportional to the drain-source voltage Vds. Accordingly, it is possible to detect the output current from the output transistor 110 by monitoring the drain-source voltage Vds of the output transistor 110 by the offset comparator. The drain-source voltage Vds of the output transistor 110 becomes equal to or more than an offset voltage of the offset comparator, then the current detection circuit 315 outputs the current detection signal 134.

During input of the non-saturation detection signal 131 to the logic circuit 318, the logic circuit 318 determines that the power supply voltage Vin drops and the current detection accuracy of the current detection circuit 115 is deteriorated, and does not output the second enable signal 133 to the watchdog timer 116 irrespective of whether or not the enable signal 132 is provided to the logic circuit 318. Further, even in a case where the non-saturation detection signal 131 is provided to the logic circuit 318, the logic circuit 318 outputs the second enable signal 133 to the watchdog timer 116 during a period in which the current detection signal 134 is provided to the logic circuit 318.

As described above, with the semiconductor device 300 including the monitoring circuit 314 according to the third embodiment, when the power supply voltage Vin is high and the output transistor 110 is in the saturation state, it is possible to determine by the current detection circuit 215 whether the MPU 101 is in the operation mode or the stand-by mode. Even when the power supply voltage Vin drops and the output transistor 0 enters the non-saturation state, it is possible to determine whether the MPU 101 is in the operation mode or the stand-by mode using the second current detection circuit 315. Consequently, it is possible to control the watchdog timer 116 based on the operation state of the MPU 101 over a wide range of the power supply voltage Vin, to thereby stabilize the monitoring operation.

As described above, according to the monitoring circuit of the present invention, the possibility that the output transistor may enter the non-saturation state is detected by the non-saturation detection circuit, and the current detection circuit or the watchdog timer is controlled to be stopped, with the result that power consumption of the semiconductor device can be suppressed. Further, even when the output transistor enters the non-saturation state, the monitoring operation of the watchdog timer can be stabilized.

The present invention is not limited to the configurations described in the above-mentioned embodiments, and it is understood that various modifications can be made thereto without departing from the gist of the present invention. For example, the current detection circuit may include a switch circuit to have a configuration in which supply of an operation current to the comparator is cut by the non-saturation detection signal. Further, for example, the comparator and a voltage detection means that are included in the non-saturation detection circuit and the current detection circuit may be provided with hysteresis so that the output is stabilized with respect to noise of the input signal, and may be provided with a noise filter for the output.

What is claimed is:

1. A monitoring circuit for a system including an LDO regulator configured to supply a power supply voltage to a semiconductor device under surveillance,
the monitoring circuit comprising:
a non-saturation detection circuit configured to detect a non-saturation state of an output transistor of the LDO regulator;
a current detection circuit configured to detect that an output current from the output transistor is equal to or more than a predetermined current value; and
a watchdog timer configured to monitor operation of the semiconductor device under surveillance,
operation of the watchdog timer being halted according to detection of a non-saturation state of the output transistor by the non-saturation detection circuit.

2. A monitoring circuit according to claim 1:
wherein the non-saturation detection circuit is configured to output a non-saturation detection signal to the current detection circuit according to detection of a non-saturation state of the output transistor; and
wherein the current detection circuit is configured to, during a period in which the non-saturation detection signal is not provided to the current detection circuit, output an enable signal to the watchdog timer according to detection that an output current from the output transistor is equal to or more than a predetermined current value.

3. A monitoring circuit according to claim 2, wherein the current detection circuit includes a switch circuit configured to be turned off during a period in which the non-saturation detection signal is provided to the current detection circuit so that an operation current is reduced.

4. A monitoring circuit according to claim 2, further comprising a logic circuit:
wherein the non-saturation detection circuit is configured to output a non-saturation detection signal to the logic circuit according to detection of a non-saturation state of the output transistor;
wherein the current detection circuit is configured to output the enable signal to the logic circuit according to detection that an output current from the output transistor is equal to or more than a predetermined current value; and
wherein the logic circuit is configured to output a second enable signal to the watchdog timer based on the enable signal during a period in which the non-saturation detection signal is not provided to the logic circuit.

5. A monitoring circuit according to claim 4, further comprising a second current detection circuit configured to output a current detection signal to the logic circuit according to detection that an output current from the output transistor is equal to or more than a predetermined current value,
wherein the logic circuit is configured to output the second enable signal to the watchdog timer based on the current detection signal during a period in which the non-saturation detection signal is provided to the logic circuit.

6. A semiconductor device, comprising:
the monitoring circuit of claim 1 configured to monitor operation of a semiconductor device under surveillance; and
an LDO regulator configured to supply a power supply voltage to the semiconductor device under surveillance.

7. A semiconductor device, comprising:
the monitoring circuit of claim 2 configured to monitor operation of a semiconductor device under surveillance; and
an LDO regulator configured to supply a power supply voltage to the semiconductor device under surveillance.

8. A semiconductor device, comprising:
the monitoring circuit of claim 3 configured to monitor operation of a semiconductor device under surveillance; and
an LDO regulator configured to supply a power supply voltage to the semiconductor device under surveillance.

9. A semiconductor device, comprising:
the monitoring circuit of claim 4 configured to monitor operation of a semiconductor device under surveillance; and
an LDO regulator configured to supply a power supply voltage to the semiconductor device under surveillance.

10. A semiconductor device, comprising:
the monitoring circuit of claim 5 configured to monitor operation of a semiconductor device under surveillance; and
an LDO regulator configured to supply a power supply voltage to the semiconductor device under surveillance.

* * * * *